(12) United States Patent
Zhang et al.

(10) Patent No.: US 8,737,078 B2
(45) Date of Patent: May 27, 2014

(54) COMPUTER SERVER RETAINING APPARATUS AND SERVER CABINET USING THE SAME

(71) Applicants: Hong Fu Jin Precision Industry (ShenZhen) Co., Ltd., Shenzhen (CN); Hon Hai Precision Industry Co., Ltd., New Taipei (TW)

(72) Inventors: Guang-Yi Zhang, Shenzhen (CN); Tie-Shan Jiang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/688,583

(22) Filed: Nov. 29, 2012

(65) Prior Publication Data
US 2013/0241377 A1    Sep. 19, 2013

(30) Foreign Application Priority Data

Mar. 15, 2012 (CN) .......................... 2012 1 0067649

(51) Int. Cl.
| | |
|---|---|
| *H05K 5/00* | (2006.01) |
| *H05K 7/00* | (2006.01) |
| *G06F 1/16* | (2006.01) |
| *A47B 81/00* | (2006.01) |
| *A47B 97/00* | (2006.01) |
| *H05K 7/14* | (2006.01) |
| *G06F 1/18* | (2006.01) |

(52) U.S. Cl.
CPC ............ *H05K 7/1489* (2013.01); *H05K 7/1485* (2013.01); *H05K 7/1488* (2013.01); *G06F 1/181* (2013.01); *G06F 1/185* (2013.01); *G06F 1/186* (2013.01)

USPC ...... 361/726; 361/679.57; 361/724; 361/725; 361/727; 312/223.1; 312/223.2

(58) Field of Classification Search
CPC ..... H05K 5/00; H05K 5/0004; H05K 5/0008; H05K 5/0013; H05K 5/0204; H05K 5/0208; H05K 5/0217; H05K 5/0221; H05K 5/0226; H05K 5/04; H05K 7/14; H05K 7/1411; H05K 7/1421; H05K 7/1485; H05K 7/1488; H05K 7/1489; G06F 1/181; G06F 1/185; G06F 1/186; G06F 1/188
USPC .................... 361/679.57, 724, 725, 726, 727; 312/223.1, 223.2
See application file for complete search history.

(56) References Cited

U.S. PATENT DOCUMENTS

| | | | |
|---|---|---|---|
| 7,576,978 B2* | 8/2009 | Fan et al. | 361/679.37 |
| 7,633,760 B2* | 12/2009 | Wu et al. | 361/727 |
| 7,881,062 B2* | 2/2011 | Chen et al. | 361/725 |
| 8,104,626 B2* | 1/2012 | Huang et al. | 211/26 |
| 8,369,087 B2* | 2/2013 | Wu et al. | 361/679.58 |
| 8,456,844 B2* | 6/2013 | Chou et al. | 361/727 |
| 2004/0120106 A1* | 6/2004 | Searby et al. | 361/683 |
| 2006/0274508 A1* | 12/2006 | LaRiviere et al. | 361/727 |

* cited by examiner

*Primary Examiner* — Anthony Haughton
(74) *Attorney, Agent, or Firm* — Novak Druce Connolly Bove + Quigg LLP (57) ABSTRACT

A server cabinet for retaining at least one computer server includes a plurality of perforated holding poles and a plurality of retaining apparatuses. Each of the plurality of retaining apparatuses can be secured to a computer server and clamp a holding pole, such that the computer server is secured on the plurality of holding poles both vertically and horizontally by the plurality of retaining apparatuses.

14 Claims, 6 Drawing Sheets

COMPUTER SERVER RETAINING APPARATUS AND SERVER CABINET USING THE SAME

BACKGROUND

1. Technical Field

The present disclosure relates to computer server systems, and particularly to a computer server retaining apparatus and a server cabinet using the same.

2. Description of Related Art

A computer system can employ a plurality of servers to enhance data processing capability. For example, a common four-in-one server computer system includes four servers. All of the servers can be received in one server cabinet and share one hard disk backboard that is electrically connected to several hard disk drives.

Generally, a server cabinet may include a plurality of erect holding poles. A plurality of servers can be mounted on the holding poles and positioned at different heights. For attaching servers to and detaching servers from the server cabinet easily, each server mounted on the holding poles is held vertically (i.e., is prevented from moving upward and downward), but may be not stably held horizontally (i.e., is not prevented from moving horizontally). However, when such a server cabinet is transported, the server(s) in the server cabinet may slide horizontally (e.g., due to impacts or inertia) and fall from the server cabinet.

Therefore, there is room for improvement within the art.

BRIEF DESCRIPTION OF THE DRAWINGS

Many aspects of the present disclosure can be better understood with reference to the following drawings. The components in the various drawings are not necessarily drawn to scale, the emphasis instead being placed upon clearly illustrating the principles of the present disclosure. Moreover, in the drawings, like reference numerals designate corresponding parts throughout the figure.

DETAILED DESCRIPTION

Figure 1:
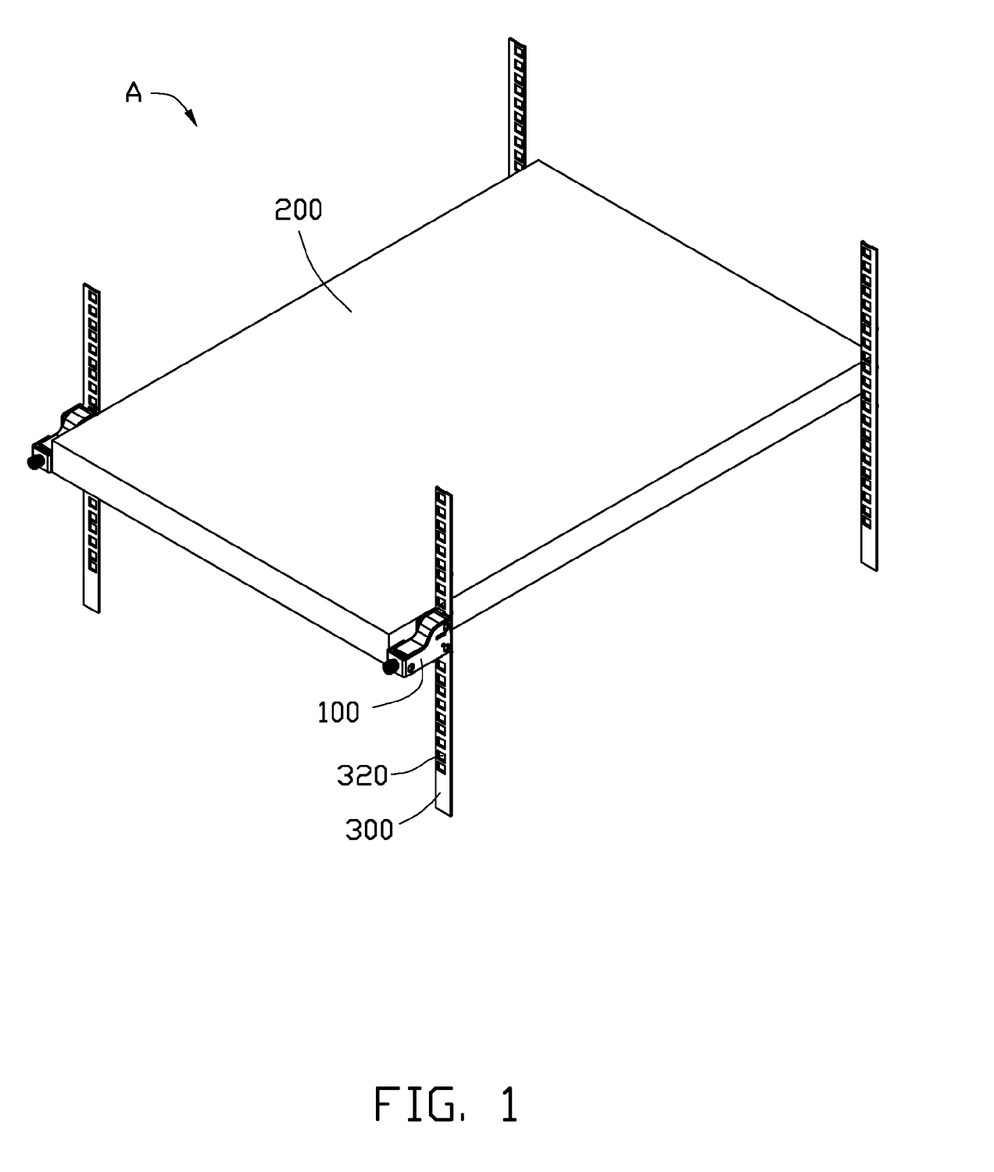
FIG. 1 is a schematic view of a server cabinet, according to an exemplary embodiment.

FIG. 1 shows a server cabinet A, according to an exemplary embodiment. The server cabinet A includes a plurality of retaining apparatuses 100 and a plurality of erect holding poles 300. At least one computer server 200 can be mounted on the holding holes 300 via the retaining apparatuses 100, and is secured both vertically and horizontally by the retaining apparatuses 100. In this embodiment, each of the holding poles 300 defines a plurality of holding holes 320. Each of the retaining apparatuses 100 is fixed to the server 200, and engaged with a holding hole 320, so that the server 200 is mounted at a predetermined height on the holding poles 300.

Figure 2:
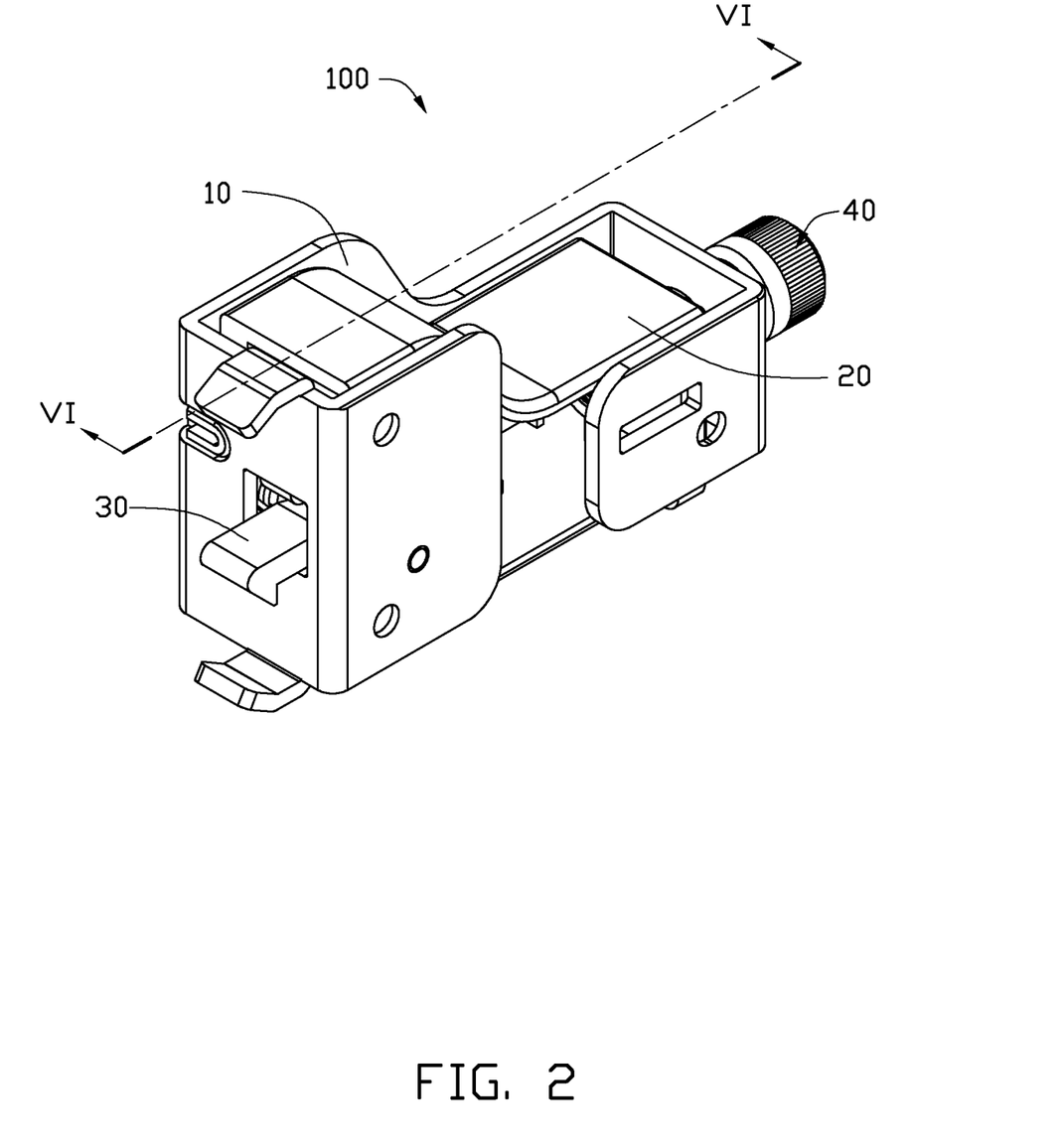
FIG. 2 is a schematic view of a retaining apparatus, according to an exemplary embodiment.

Also referring to FIG. 2, each of the retaining apparatuses 100 includes an outer case 10, an inner case 20, a rotation element 30 and an operation mechanism 40. The inner case 20, the rotation element 30, and the operation mechanism 40 are all received in the outer case 10, and the rotation element 30 and the operation mechanism 40 are exposed out of opposite ends of the outer case 10. The outer case 10 is secured on the server 200. The rotation element 30 engages with the holding holes 320 of the holding poles 300, and operations applied to the operation mechanism 40 act on the rotation element 30 to rotate and fasten the retaining apparatus 100 on a holding pole 300.

Figure 3:
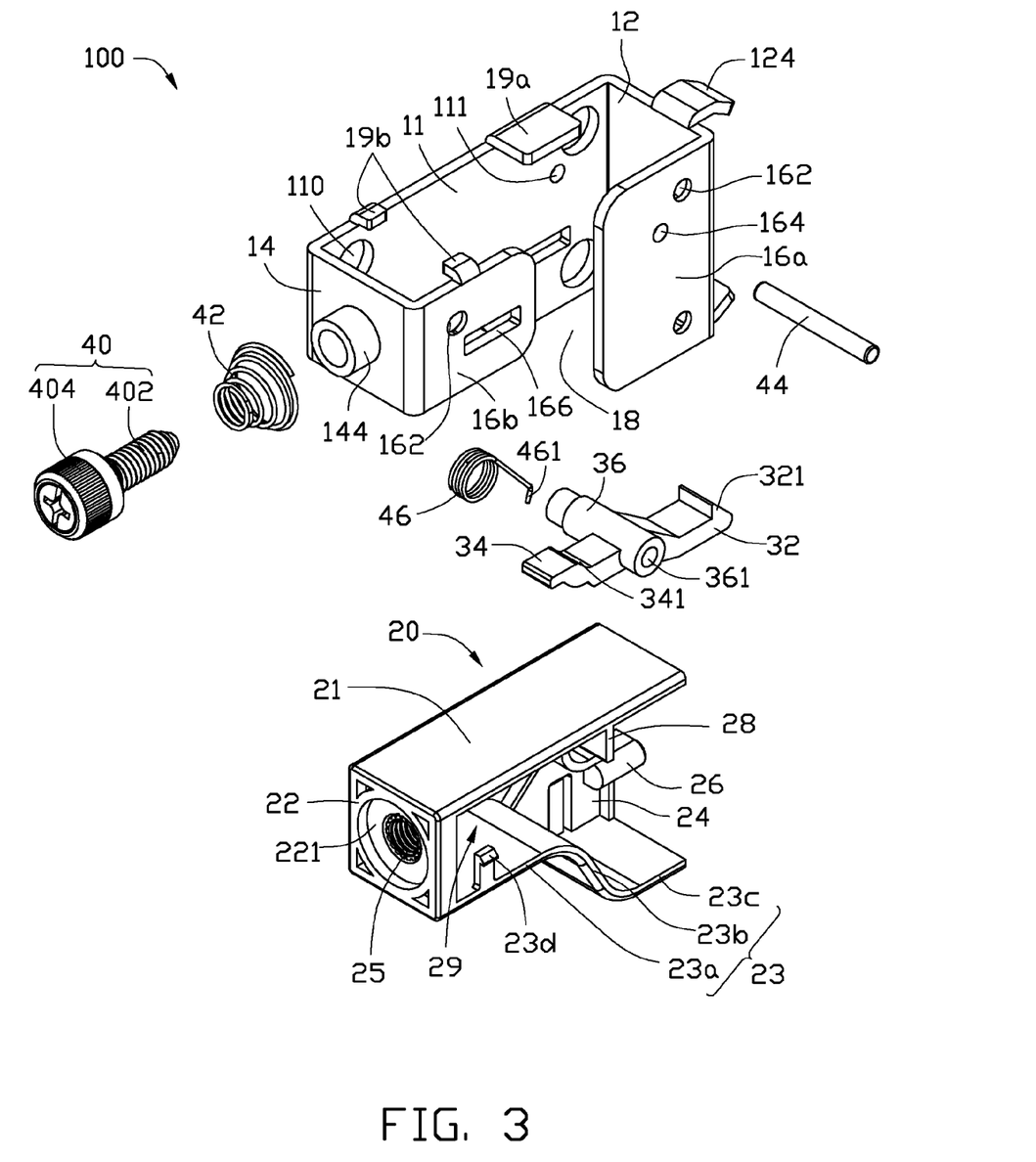
FIG. 3 is a disassembled view of the retaining apparatus shown in FIG. 2.
Figure 4:
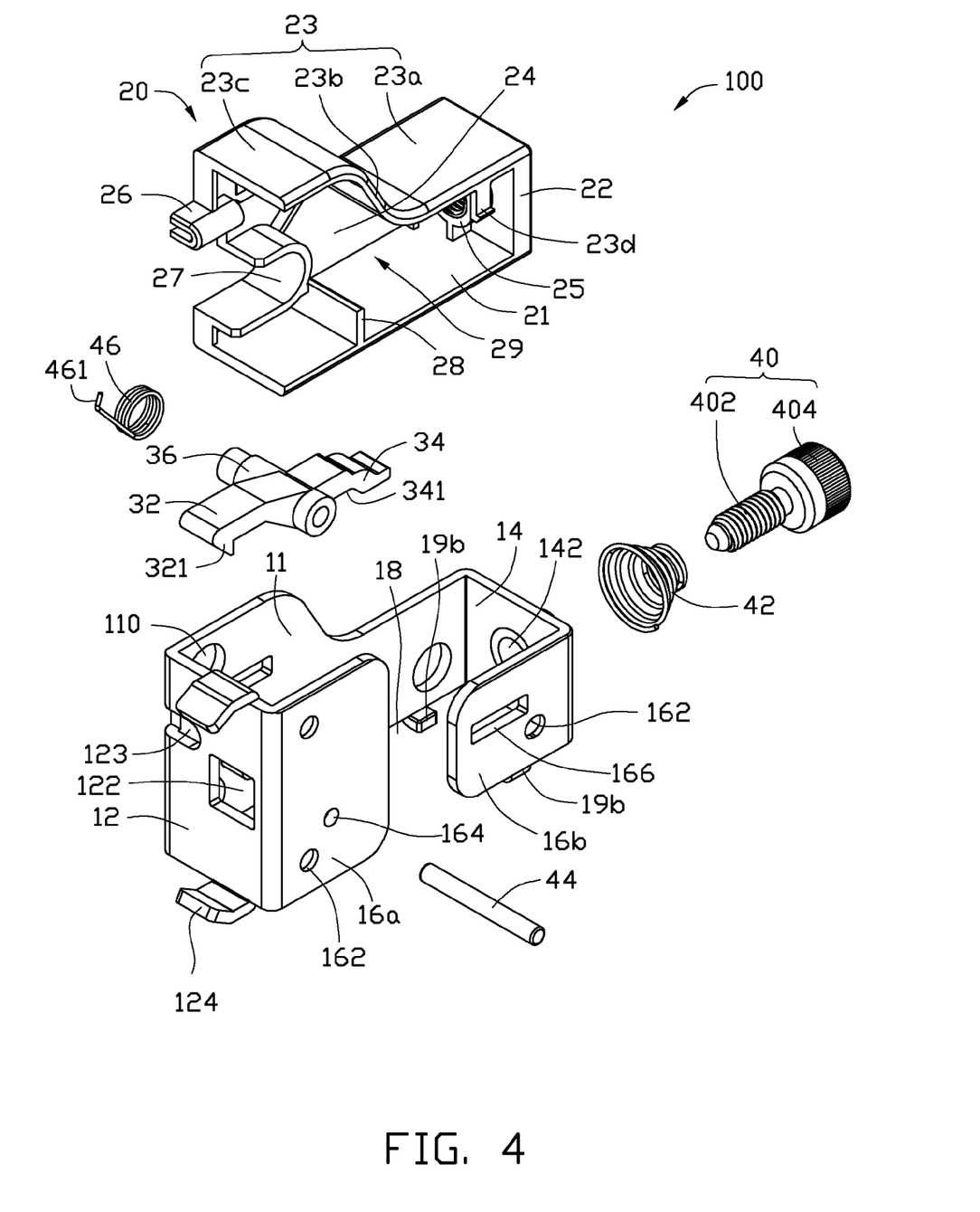
FIG. 4 is similar to FIG. 3, but from another aspect.

Also referring to FIGS. 3 and 4, the outer case 10 includes a first outer wall 11, a second outer wall 12, a third outer wall 14, a fourth outer wall 16a, and a fifth outer wall 16b. The first outer wall 11, the second outer wall 12, the third outer wall 14, the fourth outer wall 16a, and the fifth outer wall 16b are all substantially planar boards. The first outer wall 11 is approximately L-shaped, that is, one end of the first outer wall 11 is wider than another opposite end of the first outer wall 11. The second outer wall 12 is perpendicularly connected to the wider end of the first outer wall 11, the third outer wall 14 is perpendicularly connected to the narrower end of the first outer wall 11, and a length of the second outer wall 12 is greater than a length of the third outer wall 14. The fourth outer wall 16a is perpendicularly connected to the second outer wall 12, and a width of the fourth outer wall 16a equals a width of the second outer wall 12. The fifth outer wall 16b is perpendicularly connected to the third outer wall 14, and a width of the fifth outer wall 16b equals a width of the third outer wall 14. Both the fourth outer wall 16a and the fifth outer wall 16b are parallel to the first outer wall 11, and the fourth outer wall 16a and the fifth outer wall 16b are coplanar. Furthermore, the fourth outer wall 16a and the fifth outer wall 16b extend towards each other, such that the first outer wall 11, the second outer wall 12, the third outer wall 14, the fourth outer wall 16a, and the fifth outer wall 16b cooperatively form a first reception space 18.

The first outer wall 11 defines at least three first assembly holes 110 and a first axle hole 111. The second outer wall 12 defines a first engaging hole 122 in a central portion thereof and a second engaging hole 123 in a peripheral portion thereof. Two first latching hooks 124 perpendicularly extend from two opposite ends of an outer surface of the second outer wall 12 respectively, and are bent towards each other. The third outer wall 14 defines a third engaging hole 142 in a central portion thereof. An engaging pipe 144 is formed on an outer surface of the third outer wall 14. The engaging pipe 144 is a hollow cylinder and is perpendicularly connected to a central portion of the outer surface of the third outer wall 14. A central hole (not labeled) of the engaging pipe 144 is aligned with the third engaging hole 142. The fourth outer wall 16a defines at least two second assembly holes 162 and a second axle hole 164. The fifth outer wall 16b defines at least one second assembly hole 162 and a sliding groove 166.

The outer case 10 includes a first partition element 19a and two second partition elements 19b. The first partition element 19a and the two second partition elements 19b are all substantially planar boards and are coplanar with each other. The first partition element 19a and one of the two second partition elements 19b are perpendicularly connected to a side edge of the first outer wall 11, and the other of the two second partition elements 19b is perpendicularly connected to a side edge of the fifth outer wall 16b. The first partition element 19a extends towards the second outer wall 12. The two second partition elements 19b extend towards each other.

The inner case 20 includes a first inner wall 21, a second inner wall 22, a third inner wall 23, and a fourth inner wall 24. Both the first inner wall 21 and the second inner wall 22 are substantially planar boards, and the second inner wall 22 is perpendicularly connected to an end of the first inner wall 21. A round central portion of an outer surface of the second inner wall 22 is recessed to form a round assembly recess 221. An inner-threaded pipe 25 is perpendicularly connected to a central portion of an inner surface of the second inner wall 22, and opens out at a central portion of a bottom of the assembly recess 221. The third inner wall 23 includes a first wall portion 23a, a second wall portion 23b, and a third wall portion 23c. The first wall portion 23a is substantially a planar board perpendicularly connected to the second inner wall 22 and extending parallel to the first inner wall 21. The second wall portion 23b is substantially a curved board. One end of the second wall portion 23b is connected to the first wall portion 23a, and the other end of the second wall portion 23b is smoothly bent away from the first inner wall 21 and connected to the third wall portion 23c. The third wall portion 23c is substantially a planar board extending parallel to the first inner wall 21, and a distance between the first inner wall 21 and the third wall portion 23c is greater than a distance between the first inner wall 21 and the first wall portion 23a.

The fourth inner wall 24 is substantially a planar board, and the first inner wall 21, the second inner wall 22, and the third inner wall 23 are all perpendicularly connected to a same surface of the fourth wall portion 24, such that the first inner wall 21, the second inner wall 22, the third inner wall 23, and the fourth inner wall 24 cooperatively form a second reception space 29.

A second latching hook 23d is perpendicularly connected to a side edge of the first wall portion 23a that is opposite to the fourth inner wall 24. The second latching hook 23d extends towards the first inner wall 21, and a distal end of the second latching hook 23d (not labeled) is bent outwards, that is, bent away from the fourth inner wall 24 and exposed out of the second reception space 29. A flange 28 is perpendicularly connected to an inner surface of the first inner wall 21 and is aligned with the end of the second wall portion 23b that is connected to the third wall portion 23c. The inner case 20 further includes a first engaging element 26 and a second engaging element 27. Each of the first engaging element 26 and the second engaging element 27 is a board bent into a shape of a "U." The first engaging element 26 is fixed to an end of the fourth inner wall 24 that is opposite to the second inner wall 22 and recessed into the second reception space 29. A side edge of the first engaging element 26 protrudes beyond side edges of the first inner wall 21, the third inner wall 23, and the fourth inner wall 24, and is exposed out of the second reception space 29. One side edge of the second engaging element 27 is perpendicularly connected to the fourth inner wall 24, and opens out at the fourth inner wall 24. The other side edge of the second engaging element 27 extends into the second reception space 29. A width of the second engaging element 27 is less than a width of the first inner wall 21. A bottom of the second engaging element 27 is connected to the flange 28.

In this embodiment, a length of the first outer wall 11 is greater than a length of the first inner wall 21 and a length of the fourth inner wall 24. A length of the second outer wall 12 approximately equals a distance between the first inner wall 21 and the third wall portion 23c. A length of the third outer wall 14 approximately equals a length of the second inner wall 22. Widths of the second outer wall 12 and the third outer wall 14 approximately equal widths of the first inner wall 21, the second inner wall 22, and the third inner wall 23. In this way, the inner case 20 can be received in the outer case 10 and can move along an extending direction of the first inner wall 21 in the outer case 10.

The rotation element 30 includes a first arm 32, a second arm 34, and a sleeve 36. The sleeve 36 is a hollow cylinder and defines a third axle hole 361 along an axis thereof. Both the first arm 32 and the second arm 34 are bars. A distal end of the first arm 32 is bent about 90 degrees to form a latching portion 321. A distal end of the second arm 34 is bent smoothly, and presents an arc-shaped contact portion 341 on a side of the second arm 34. The first arm 32 and the second arm 34 are approximately diametrically opposite to each other on the sleeve 36 and extend in opposite directions.

The operation mechanism 40 includes a fastening portion 402, a operation portion 404, a first elastic element 42, an adjusting axle 44, and a second elastic element 46. The fastening portion 402 is a threaded pole and can be screwed into the inner-threaded pipe 25. The operation portion 404 is a cylinder. A diameter of the operation portion 404 is greater than a diameter of the fastening portion 402, and the operation portion 404 is coaxially connected to an end of the fastening portion 402. The first elastic element 42 is a helical spring and can be coiled on the fastening portion 402. The adjusting axle 44 is a cylinder and can be inserted into the first axle hole 111, the second axle hole 164, and the third axle hole 361. The second elastic element 46 is a torsional spring and can be coiled on the sleeve 36. The second elastic element 46 has an extending end 461, and the extending end 461 is resilient.

Figure 5:
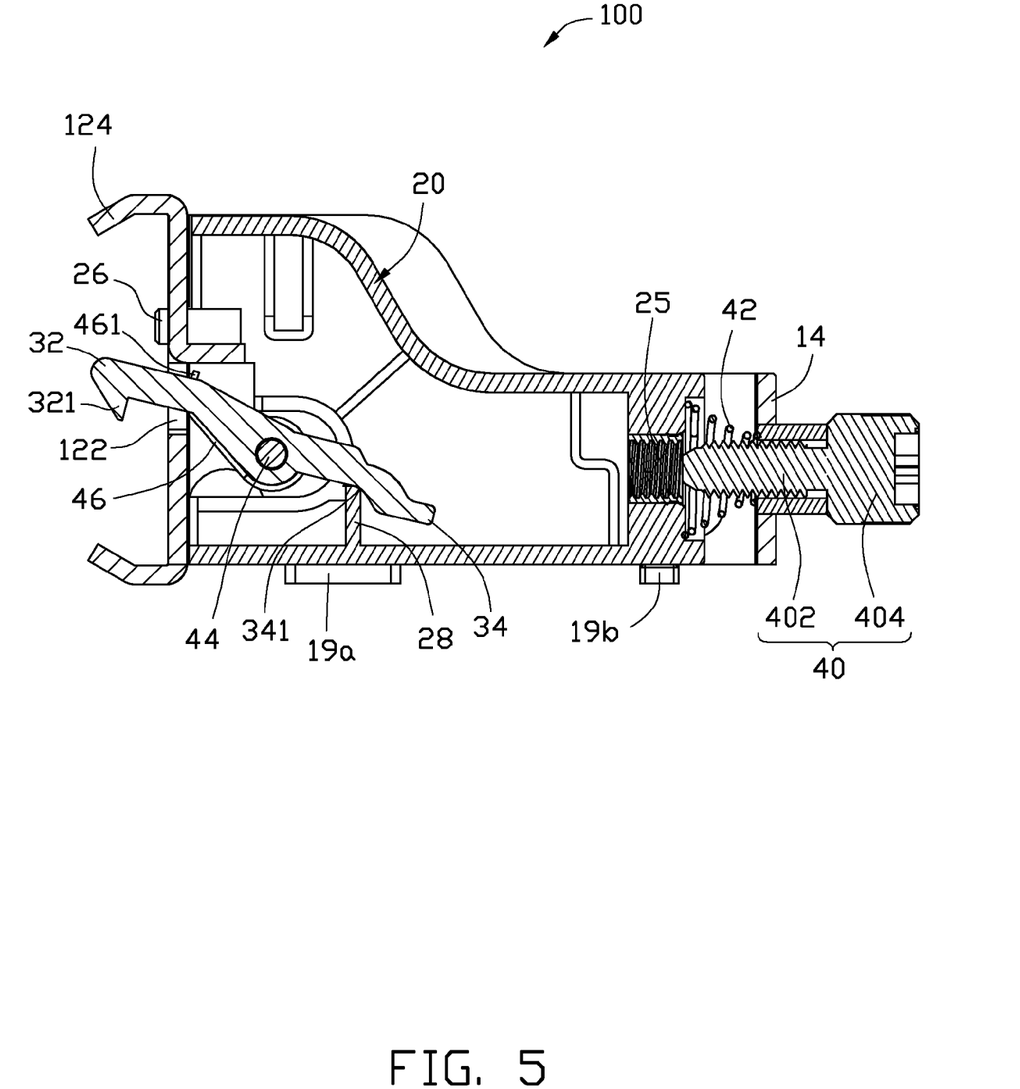
FIG. 5 is a cutaway view of the retaining apparatus shown in FIG. 2, wherein the computer server retaining apparatus is in an released mode.
Figure 6:
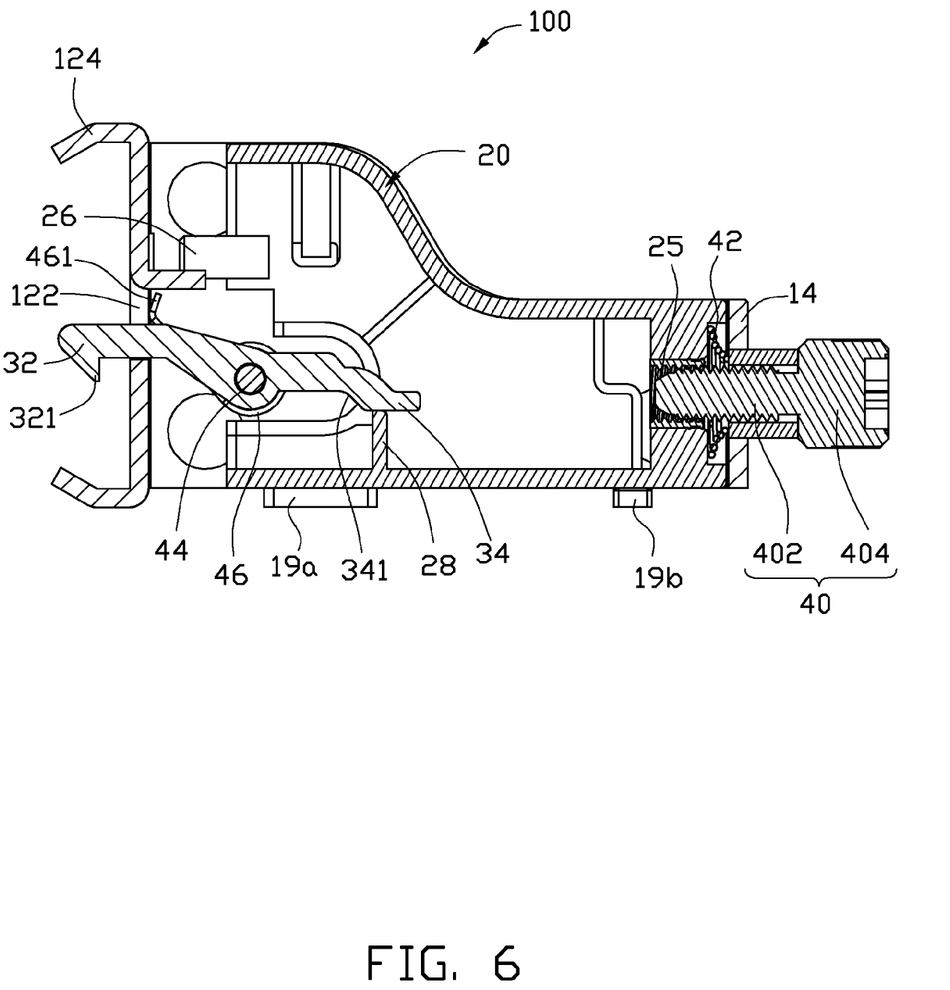
FIG. 6 is another cutaway view of the retaining apparatus shown in FIG. 2, wherein the computer server retaining apparatus is in a clamped mode.

Also referring to FIGS. 5 and 6, in assembly, the fastening portion 402 is screwed into the engaging pipe 144, and a distal end of the fastening portion 402 enters the first reception space 18 via the third engaging hole 142. The first elastic element 42 is coiled on the fastening portion 402. The inner case 20 is received in the outer case 10. The first inner wall 21 is supported by the first partition element 19a and the second partition elements 19b. The fourth inner wall 24 is aligned with the first outer wall 11. The second inner wall 22 is aligned with the third outer wall 14, and the central hole of the inner-threaded pipe 25 is aligned with the third engaging hole 142, such that the fastening portion 402 can be screwed into the inner-threaded pipe 25. The first elastic element 42 is positioned between an outer surface of the second inner wall 22 and an inner surface of the third outer wall 14. One end of the first elastic element 42 is received in the assembly recess 221 and is resisted by the bottom of the assembly recess 221, and the other end of the first elastic element 42 is resisted by the inner surface of the third outer wall 14, such that the first elastic element 42 is compressed. The first engaging element 26 is inserted in the second engaging hole 123 and is exposed out of the outer case 10 via the second engaging hole 123. A distal end of the latching hook 23d is inserted into the sliding groove 166.

According to the aforementioned assembly method, it is readily appreciated that the second reception space 29 is opened to the outside via a gap (not labeled) between the fourth outer wall 16a and the fifth outer wall 16b. Therefore, the rotation element 30 and the second elastic element 46 can be placed into the second reception space 29 via the gap between the fourth outer wall 16a and the fifth outer wall 16b. In this embodiment, the second elastic element 46 is coiled on an end of the sleeve 36, and the rotation element 30 and the second elastic element 46 are placed into the second reception space 29 via the gap between the fourth outer wall 16a and the fifth outer wall 16b. The latching portion 321 is inserted into the first engaging hole 122, and is exposed out of the outer case 10 via the first engaging hole 122. The end of the sleeve 36 with the second elastic element 46 coiled thereon is received in the second engaging element 27, and the extending end 461 of the second elastic element 46 exerts a force against the inner surface of the second outer wall 12. The third axle hole 361 is aligned with the first axle hole 111 and the second axle hole 164, and the adjusting axle 44 passes through the first axle hole 111, the third axle hole 361, and the second axle hole 164 to be rotatably received in the first axle hole 111, the third axle hole 361, and the second axle hole 164. Assembly of the retaining apparatus 100 is thus completed.

Also referring to FIG. 5, when the assembled retaining apparatus 100 is not being used to retain the server 200, the retaining apparatus 100 is in a released mode. In this condition, the fastening portion 402 is not engaged with the inner-threaded pipe 25, and the first elastic element 42 is only slightly compressed. The first engaging element 26 is inserted in the second engaging hole 123 and is exposed out of the outer case 10 via the second engaging hole 123. At the same time, the distal end of the second arm 34 extends beyond the flange 28. The extending end 461 of the second elastic element 46 is resisted by the inner surface of the second outer wall 12, and the second elastic element 46 bears against the sleeve 36. The first arm 32 is thus driven to move upwards, the second arm 34 is driven to move downwards, and the contact portion 341 is driven against the flange 28.

In use, each retaining apparatus 100 can be secured on the server 200 via the first assembly holes 110 or the second assembly holes 162. For example, conventional assembly components, such as bolts or rivets, can run through the first assembly holes 110 or the second assembly holes 162 and be secured on the server 200 to secure the retaining apparatus 100 on the server 200. In this way, both two opposite sides of each retaining apparatus 100 can be secured to the server 200.

When each retaining apparatus 100 has been secured to the server 200, the server 200 with the retaining apparatuses 100 secured thereto is attached to the holding poles 300. Each retaining apparatus 100 is attached to one of the holding poles 300, and the two first latching hooks 124 and the first arm 32 of the retaining apparatus 100 are inserted into three holding holes 320 of the holding pole 300.

Also referring to FIG. 6, the inner case 20 of the retaining apparatus 100 is moved against the third outer wall 14, the latching hook 23d slides in the sliding groove 166, and the fastening portion 402 is then screwed into the inner-threaded pipe 25 by rotating the operation portion 404. The first engaging portion 26 exits from the second engaging hole 123. Since the rotation element 30 is rotatably mounted on the outer case 10 via the adjusting axle 44, the flange 28 slides along the contact portion 341 and pushes against the contact portion 341 and forces the distal end of the second arm 34 to move upwards. Thus, the rotation element 30 is driven to rotate relative to the adjusting axle 44, and the first arm 32 moves downwards in the manner of a teeter-totter. The latching portion 321 is moved towards the outer surface of the second outer wall 12, and a portion (not shown) of the holding pole 300 that is sandwiched between the latching portion 321 and the second outer wall 12 is tightly clamped. In this way, the retaining apparatus 100 is in a clamped mode, and the server 200 is thus secured both vertically and horizontally by the retaining apparatuses 100.

In the aforementioned clamped mode of the retaining apparatus 100, the first elastic element 42 is compressed between the bottom of the assembly recess 221 and the inner surface of the third outer wall 14. At the same time, the second elastic element 46 undergoes further torsion. When the retaining apparatus 100 needs to be detached from the holding pole 300, the fastening portion 402 is unscrewed from the inner-threaded pipe 25. The first elastic element 42 then restores and pushes the inner case 20 towards the second outer wall 12. When the flange 28 slides from under the contact portion 341, the second arm 34 is not blocked by the flange 28, and the second elastic element 46 restores, to rotate the rotation element 30. In this way, the retaining apparatus 100 returns to the released mode and the holding pole 300 is released.

It is to be further understood that even though numerous characteristics and advantages of the present embodiments have been set forth in the foregoing description, together with details of structures and functions of various embodiments, the disclosure is illustrative only, and changes may be made in detail, especially in matters of shape, size, and arrangement of parts within the principles of the present invention to the full extent indicated by the broad general meaning of the terms in which the appended claims are expressed.

What is claimed is:

1. A retaining apparatus for retaining a computer server on a server cabinet; comprising:
    an outer case configured to be secured to the computer server;
    an inner case movably received in the outer case;
    a rotation element including a sleeve, a first arm, and a second arm, wherein both the first and second arms are connected to the sleeve; the sleeve is rotatably received in the inner case, the first arm is exposed out of the outer case, and the second arm contacts the inner case;
    an operation mechanism including an adjusting axle, the adjusting axle rotatably received in the inner case, and the sleeve coiled on the adjusting axle; and
    wherein when the inner case reaches a first position in the outer case, the second arm is resisted by the inner case and drives the rotation element to rotate, and the first arm and the outer case is driven to clamp a portion of the server cabinet and secure the retaining apparatus to the server cabinet; and when the inner case reaches a second position in the outer case, the second arm is not resisted by the inner case, and the first arm and the outer case release the portion of the server cabinet which is clamped when the inner case reaches the first position.

2. The retaining apparatus of claim 1, wherein the operation mechanism further includes a first elastic element, the first elastic element is a helical spring, and two ends of the first elastic element are respectively resisted by the outer case and the inner case.

3. The retaining apparatus of claim 2, wherein the operation mechanism further includes a fastening portion, the fastening portion is a threaded pole inserted into the outer case, the inner case includes an inner-threaded pipe aligned with the fastening portion, and the inner case is moved to the first and second positions by screwing the fastening portion into and out from the inner-threaded pipe.

4. The retaining apparatus of claim 3, wherein the first elastic element is coiled on the fastening portion.

5. The retaining apparatus of claim 2, wherein the operation mechanism further includes a second elastic element, the second elastic element is a torsional spring coiled on the sleeve and includes an extending end resisted by the outer case; when the inner case reaches the first position, the second elastic element is compressed; and when the inner case reaches the second position, the second elastic element rebounds and drives the rotation element to rotate, and the first arm is driven to release the clamped portion of the server cabinet.

6. The retaining apparatus of claim 1, wherein the outer case further includes two latching hooks formed on a surface of the outer case where the first arm is exposed out, and the two latching hooks are configured to secure the retaining apparatus on the server cabinet.

7. The retaining apparatus of claim 1, wherein the outer case defines a plurality of first assembly holes in one side and a plurality of second assembly holes in another side, and the first and second assembly holes are all configured to secure the retaining apparatus to the computer server.

8. A server cabinet for retaining at least one computer server, comprising:
a plurality of holding poles; and
a plurality of retaining apparatuses, each of the plurality of retaining apparatuses including:
an outer case configured to be secured to the at least one computer server;
an inner case movably received in the outer case;
a rotation element including a sleeve, a first arm, and a second arm, wherein both the first and second arms are connected to the sleeve; the sleeve is rotatably received in the inner case, the first arm is exposed out of the outer case, and the second arm contacts the inner case; and
an operation mechanism including an adjusting axle, the adjusting axle rotatably received in the inner case, and the sleeve coiled on the adjusting axle;
wherein when the inner case reaches a first position in the outer case, the second arm is resisted by the inner case and drives the rotation element to rotate, and the first arm and the outer case is driven to clamp a portion of one of the plurality of holding poles and secure the retaining apparatus to the holding pole; and when the inner case reaches a second position in the outer case, the second arm is not resisted by the inner case, and the first arm and the outer case release the portion of the holding pole which is clamped when the inner case reaches the first position.

9. The server cabinet of claim 8, wherein the operation mechanism further includes a first elastic element, the first elastic element is a helical spring, and two ends of the first elastic element are respectively resisted by the outer case and the inner case.

10. The server cabinet of claim 9, wherein the operation mechanism further includes a fastening portion, the fastening portion is a threaded pole inserted into the outer case, the inner case includes an inner-threaded pipe aligned with the fastening portion, and the inner case is moved to the first and second positions by screwing the fastening portion into and out from the inner-threaded pipe.

11. The server cabinet of claim 10, wherein the first elastic element is coiled on the fastening portion.

12. The server cabinet of claim 9, wherein the operation mechanism further includes a second elastic element, the second elastic element is a torsional spring coiled on the sleeve and includes an extending end resisted by the outer case; when the inner case reaches the first position, the second elastic element is compressed; and when the inner case reaches the second position, the second elastic element rebounds and drives the rotation element to rotate, and the first arm is driven to release the clamped portion of the holding pole.

13. The server cabinet of claim 8, wherein the outer case of each retaining apparatus further includes two latching hooks formed on a surface of the outer case where the first arm is exposed out, each of the plurality of holding poles defines a plurality of holding holes, and the first arm and the two latching hooks are respectively inserted in three holding holes of one of the plurality of holding poles to secure the retaining apparatus on the holding pole.

14. The server cabinet of claim 8, wherein the outer case of each retaining apparatus defines a plurality of first assembly holes in one side and a plurality of second assembly holes in another side, and the first and second assembly holes are all configured to secure the retaining apparatus to the computer server.

* * * * *